United States Patent
Kim et al.

(10) Patent No.: US 11,774,647 B2
(45) Date of Patent: Oct. 3, 2023

(54) DECORATIVE MEMBER AND METHOD FOR PREPARING SAME

(71) Applicant: LG CHEM, LTD, Seoul (KR)

(72) Inventors: Yong Chan Kim, Daejeon (KR); Jeong Woo Shon, Daejeon (KR); Pilsung Jo, Daejeon (KR); Ki Hwan Kim, Daejeon (KR); Song Ho Jang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 631 days.

(21) Appl. No.: 16/617,382

(22) PCT Filed: Jun. 27, 2018

(86) PCT No.: PCT/KR2018/007282
§ 371 (c)(1),
(2) Date: Nov. 26, 2019

(87) PCT Pub. No.: WO2019/004724
PCT Pub. Date: Jan. 3, 2019

(65) Prior Publication Data
US 2021/0124100 A1   Apr. 29, 2021

(30) Foreign Application Priority Data

Jun. 27, 2017 (KR) .................. 10-2017-0081409
Oct. 20, 2017 (KR) .................. 10-2017-0136839

(51) Int. Cl.
*B32B 3/30* (2006.01)
*G02B 5/08* (2006.01)
(Continued)

(52) U.S. Cl.
CPC ............ *G02B 5/08* (2013.01); *C23C 14/0057* (2013.01); *G02B 5/003* (2013.01); *H04M 1/0283* (2013.01)

(58) Field of Classification Search
CPC ...... G02B 5/08; G02B 5/003; C23C 14/0057; H04M 1/0283; H04B 1/3838;
(Continued)

(56) References Cited

U.S. PATENT DOCUMENTS 6,111,697 A * 8/2000 Merrill .................. G02B 5/305
359/487.02
8,816,932 B2    8/2014 Kawaguchi et al.
(Continued)

FOREIGN PATENT DOCUMENTS

CN    2056903 U    5/1990
CN    101666866 A    3/2010
(Continued)

OTHER PUBLICATIONS

Mokrzycki W.S., Tatol M., Colour difference Delta E—A Survey, Machine Graphics & Visions, Apr. 2011, 20(4):383-411.
(Continued)

*Primary Examiner* — Balram T Parbadia
(74) *Attorney, Agent, or Firm* — Bryan Cave Leighton Paisner LLP

(57) ABSTRACT

The present disclosure relates to a decoration element comprising a light reflective layer; and a light absorbing layer provided on the light reflective layer, wherein the light absorbing layer has surface resistance of 20 ohm/square or greater.

17 Claims, 11 Drawing Sheets

(51) Int. Cl.
*C23C 14/00* (2006.01)
*G02B 5/00* (2006.01)
*H04M 1/02* (2006.01)

(58) Field of Classification Search
CPC ........ B32B 2307/402; B32B 2307/416; B32B 2307/418; B32B 2451/00; B32B 3/30; B32B 7/02; B32B 7/023
See application file for complete search history.

(56) References Cited

U.S. PATENT DOCUMENTS

| | | | |
|---|---|---|---|
| 8,889,570 B2 | 11/2014 | Matsumura et al. | |
| 9,067,387 B2* | 6/2015 | Fujii | B32B 33/00 |
| 9,187,820 B2 | 11/2015 | Kawaguchi et al. | |
| 2003/0031891 A1* | 2/2003 | Fields | B32B 27/302 |
| | | | 428/626 |
| 2005/0153107 A1 | 7/2005 | Iijima | |
| 2005/0181531 A1* | 8/2005 | Kamiya | H01Q 1/44 |
| | | | 438/66 |
| 2005/0233133 A1 | 10/2005 | Tamai et al. | |
| 2007/0026197 A1* | 2/2007 | Suga | B32B 27/06 |
| | | | 264/510 |
| 2008/0070013 A1* | 3/2008 | Suga | B29C 45/14811 |
| | | | 428/209 |
| 2010/0143724 A1* | 6/2010 | Johnson | B32B 27/08 |
| | | | 427/535 |
| 2010/0166997 A1* | 7/2010 | Chisaka | B32B 27/304 |
| | | | 156/60 |
| 2010/0207842 A1* | 8/2010 | Kawaguchi | C23C 14/205 |
| | | | 343/907 |
| 2011/0262713 A1 | 10/2011 | Nakao et al. | |
| 2013/0034692 A1* | 2/2013 | Fujii | B32B 27/06 |
| | | | 428/142 |
| 2013/0034693 A1* | 2/2013 | Fujii | B44C 5/04 |
| | | | 428/142 |
| 2013/0048072 A1 | 2/2013 | Choi | |
| 2013/0280487 A1* | 10/2013 | Blazy | B32B 38/06 |
| | | | 428/141 |
| 2013/0330525 A1* | 12/2013 | Yoshinaga | B60R 13/005 |
| | | | 428/201 |
| 2015/0212244 A1* | 7/2015 | Kim | C23C 14/34 |
| | | | 204/192.28 |
| 2016/0052244 A1* | 2/2016 | Kuriyama | B32B 27/283 |
| | | | 428/458 |
| 2016/0245969 A1 | 8/2016 | Banerjee et al. | |
| 2017/0052295 A1* | 2/2017 | Sakuma | B32B 27/06 |
| 2017/0113628 A1* | 4/2017 | Sugiura | B32B 15/088 |
| 2017/0197874 A1 | 7/2017 | Dumont et al. | |

FOREIGN PATENT DOCUMENTS

| | | |
|---|---|---|
| CN | 102282288 A | 12/2011 |
| CN | 102971862 A | 3/2013 |
| EP | 1 067 407 A1 | 10/2001 |
| EP | 2 383 364 A1 | 11/2011 |
| JP | 2001332130 A | 11/2001 |
| JP | 2006-276008 A | 10/2006 |
| JP | 2009090638 A | 4/2009 |
| JP | 2010173273 A | 8/2010 |
| JP | 2010188713 A | 9/2010 |
| JP | 2010197798 A | 9/2010 |
| JP | 2011251521 A | 12/2011 |
| JP | 5016722 B2 | 6/2012 |
| KR | 20020060633 A | 7/2002 |
| KR | 10-20090128490 A | 12/2009 |
| KR | 10-20150062404 A | 6/2015 |
| WO | 2011/077496 A1 | 6/2011 |
| WO | 2016/012325 A1 | 1/2016 |

OTHER PUBLICATIONS

Yunxing Ling and Shenglian Xue, "Technical Manual 1 for Painting Ink", May 2009 (4 Pages).
Xiao Lian, "Relief Pattern Printing Process", Nov. 1981 (2 Pages).

* cited by examiner

[FIG. 1]
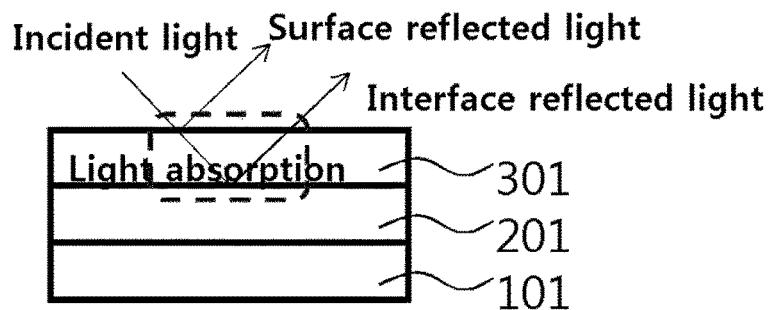
[FIG. 2]
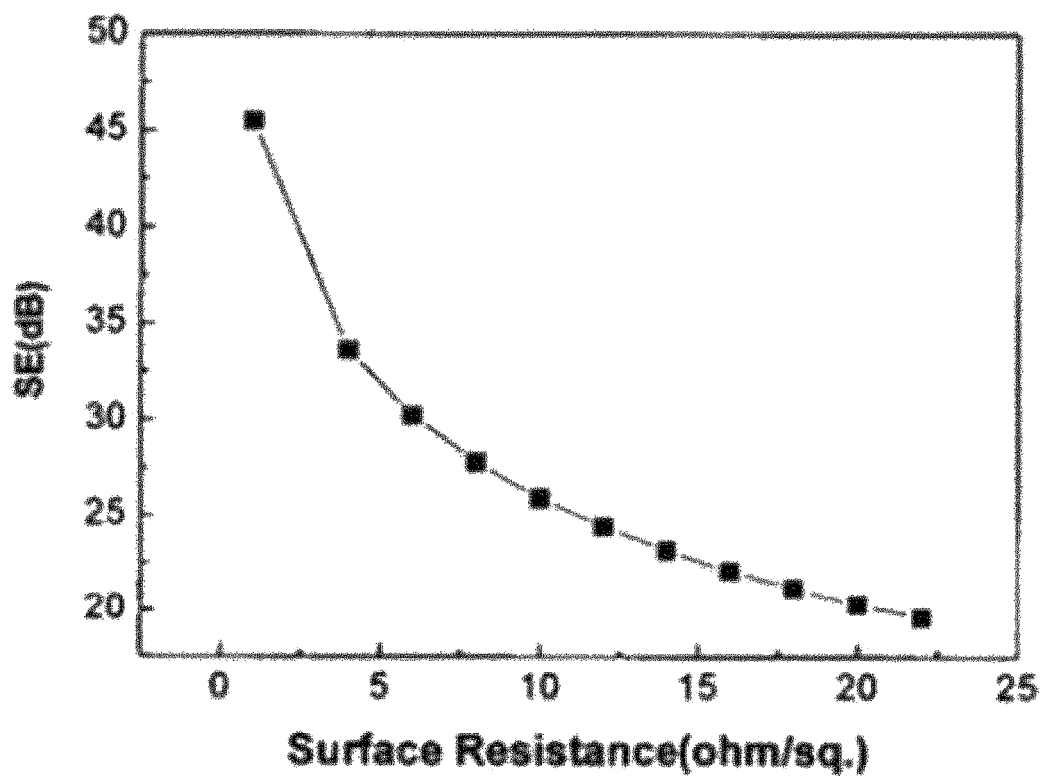

【FIG. 3】
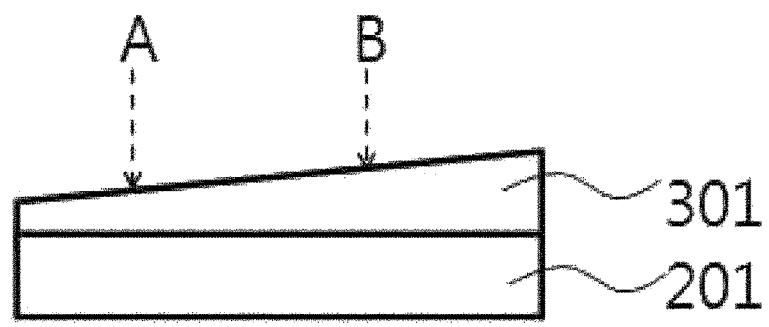
【FIG. 4】
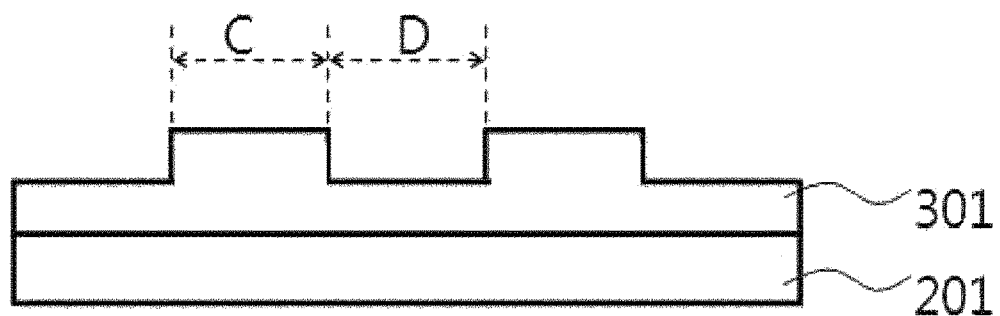

【FIG. 5】
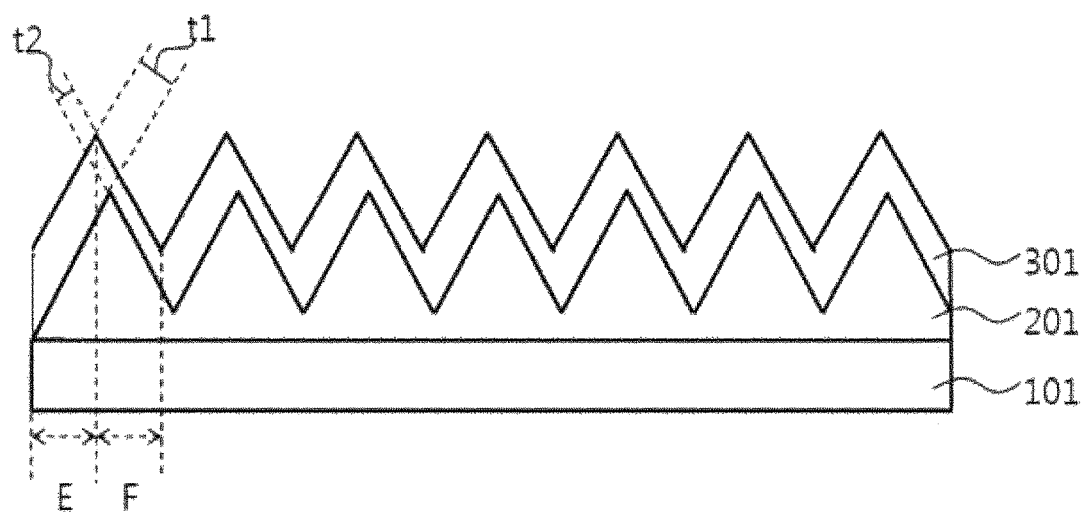
【FIG. 6】
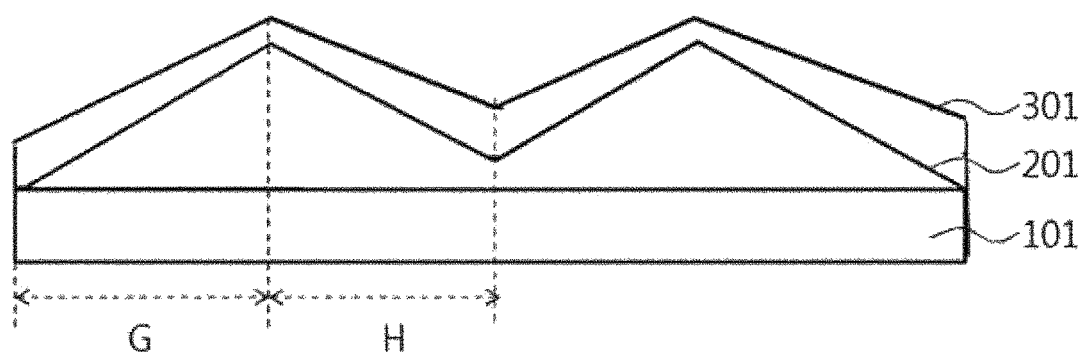

[FIG. 7]
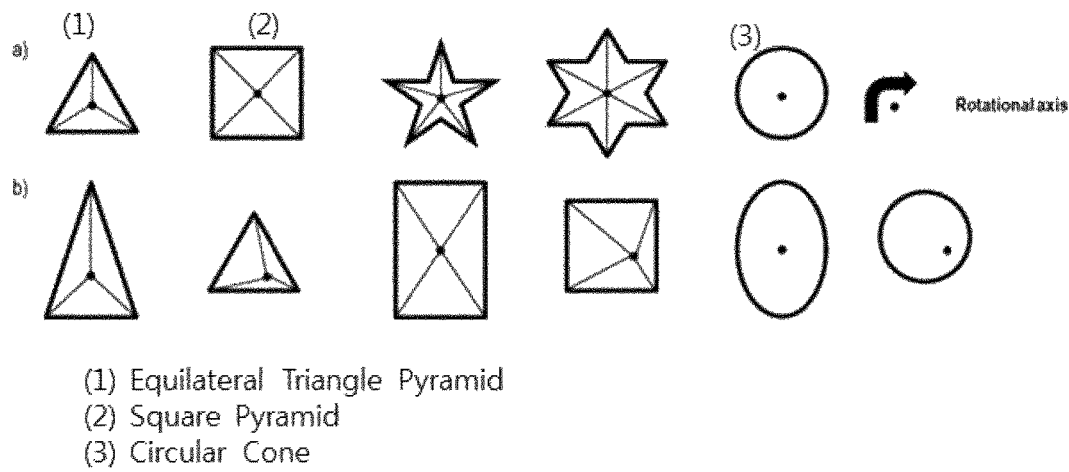
(1) Equilateral Triangle Pyramid
(2) Square Pyramid
(3) Circular Cone
[FIG. 8]
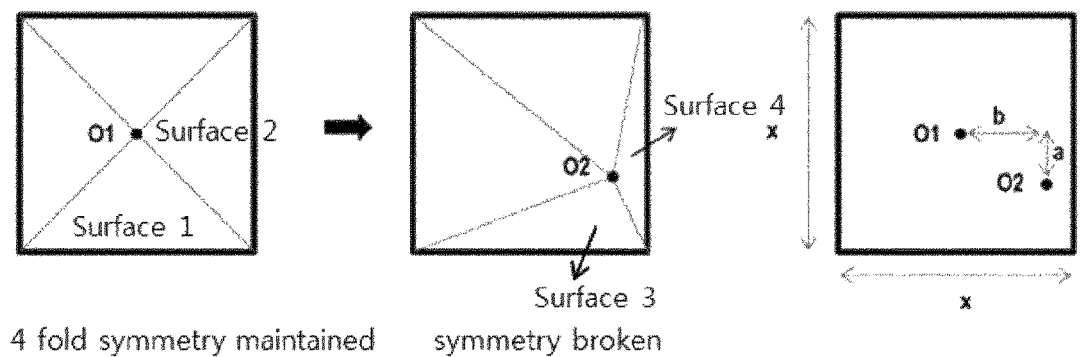
4 fold symmetry maintained   symmetry broken

[FIG. 9(a)]
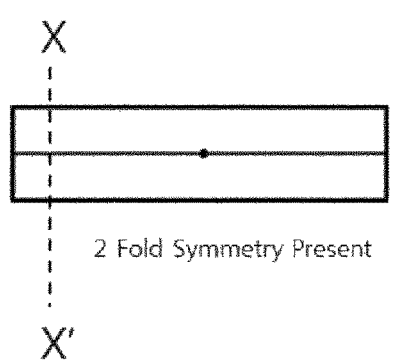
2 Fold Symmetry Present
[FIG. 9(b)]
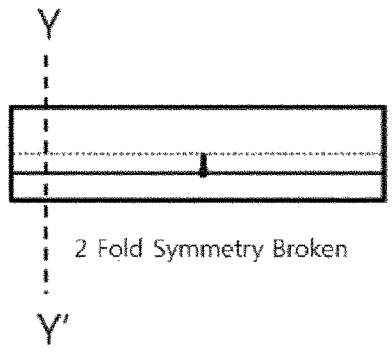
2 Fold Symmetry Broken
Rotational axis
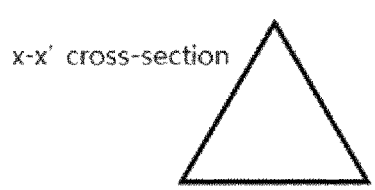
x-x' cross-section
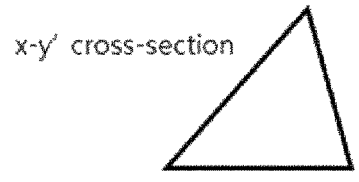
x-y' cross-section
[FIG. 10]
(a) 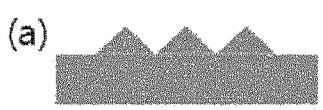
(b) 
(c) 
(d) 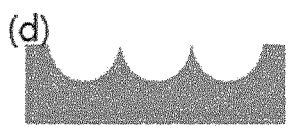
(e) 
(f) 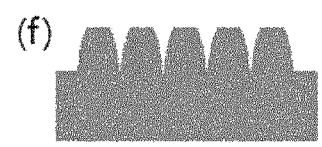
(g) 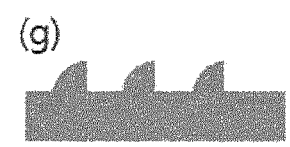
(h) 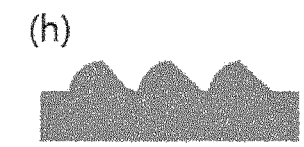
(i) 

[FIG. 11(a)]
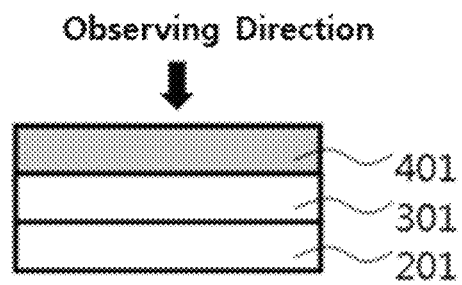
[FIG. 11(b)]
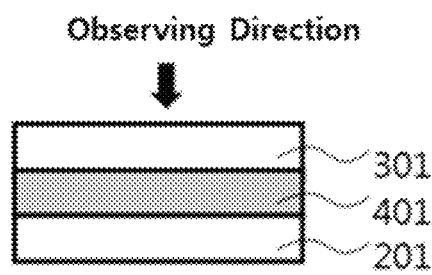
[FIG. 11(c)]
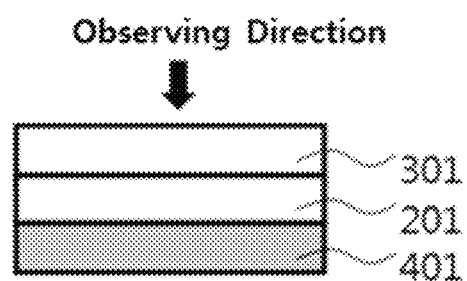

[FIG. 12(a)]
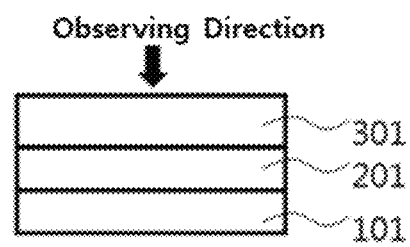
[FIG. 12(b)]
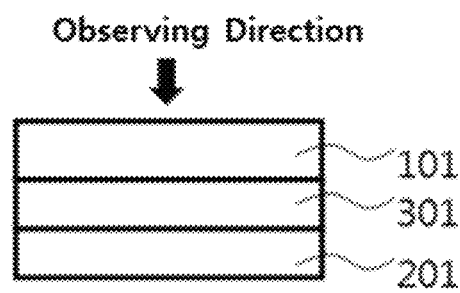

[FIG. 13(a)]
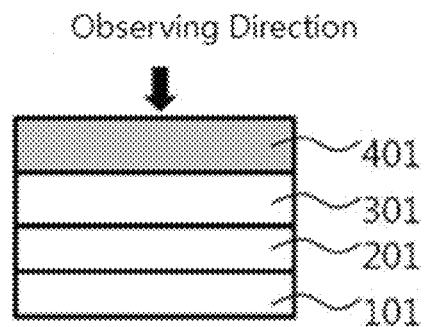
[FIG. 13(b)]
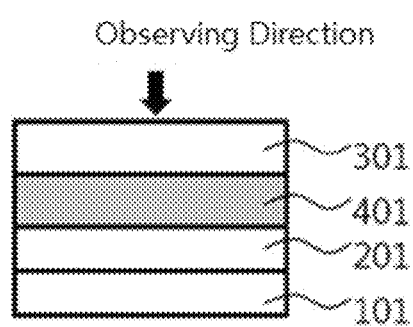
[FIG. 13(c)]
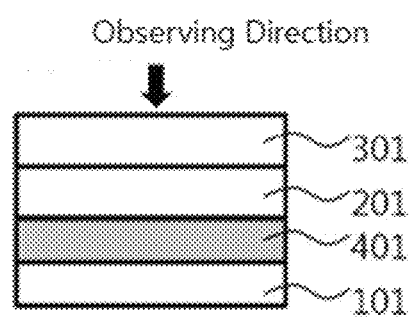
[FIG. 13(d)]
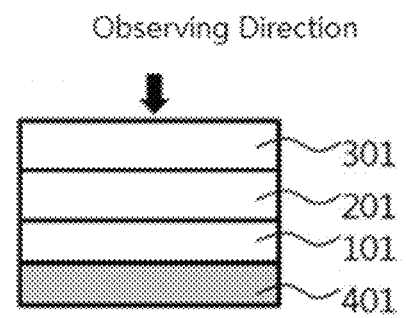
[FIG. 13(e)]
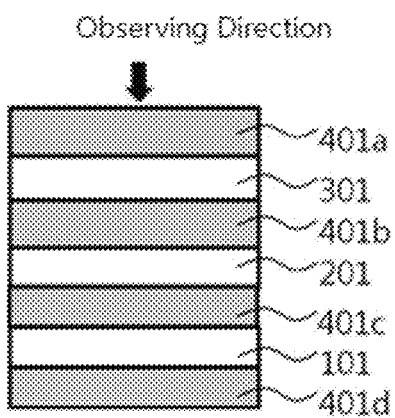

[FIG. 14(a)]
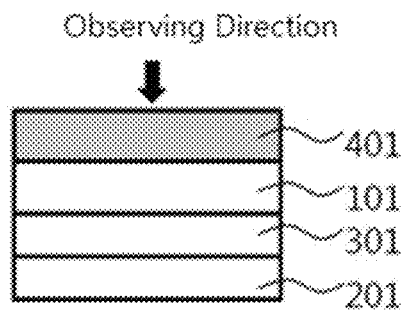
[FIG. 14(b)]
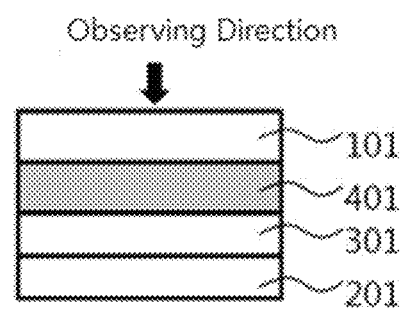
[FIG. 14(c)]
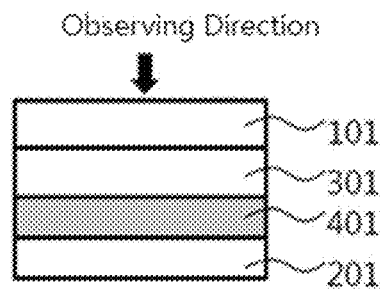
[FIG. 14(d)]
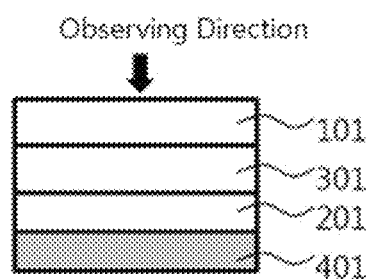
[FIG. 14(e)]
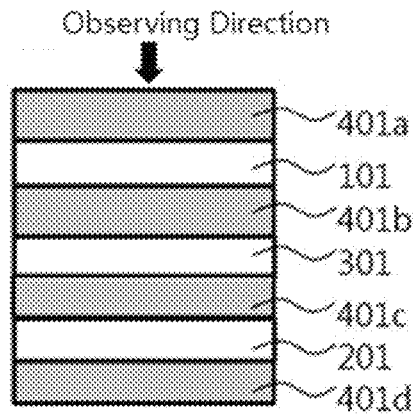

[FIG. 15]

| $N_2$ Flow Rate (sccm) | $AlO_xN_y$ | | | Specific Resistance ($\Omega \cdot cm$) | Color (CIE Color coordinate, Color) | |
|---|---|---|---|---|---|---|
| | Elemental content (Atomic %) | Relation Value | Surface Resistance ($\Omega/\square$) | | | |
| 6 | Al: 58.0±0.4<br>O: 4.8±1.5<br>N: 37.2±0.8 | 1.4 | 16 | $2 \times 10^{-4}$ | (51,1,7) | Light brown |
| 4 | Al: 57.6±0.5<br>O: 5.9±1.3<br>N: 36.5±0.8 | 1.4 | 4.7 | $2 \times 10^{-5}$ | (57,4,19) | Gold |

[FIG. 16]
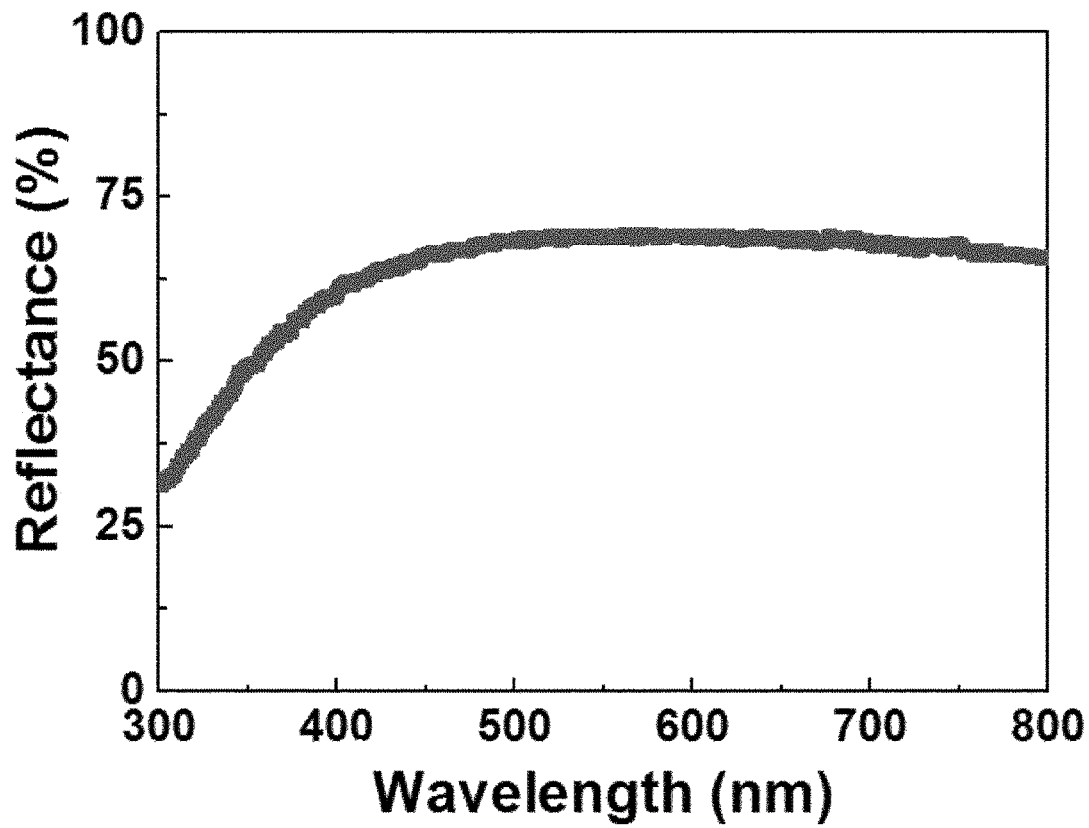
[FIG. 17]
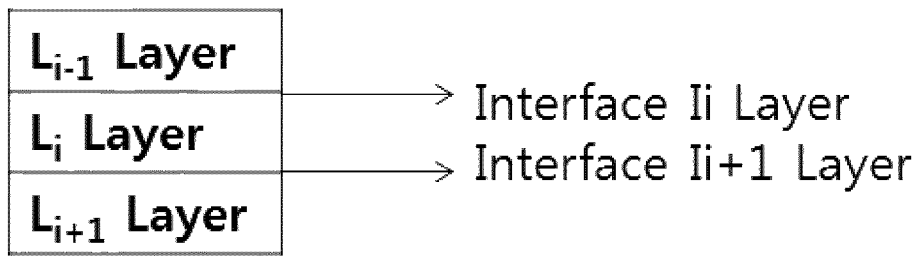

DECORATIVE MEMBER AND METHOD FOR PREPARING SAME

CROSS-REFERENCE TO RELATED APPLICATIONS

This application is the U.S. national stage of international Application No. PCT/KR2018/007282 filed Jun. 27, 2018, and claims priority to and the benefits of Korean Patent Application No. 10-2017-0081409, filed with the Korean Intellectual Property Office on Jun. 27, 2017, and Korean Patent Application No. 10-2014-0136839, filed with the Korean Intellectual Property Office on Oct. 20, 2017, the entire contents of which are incorporated herein by reference.

TECHNICAL FIELD

The present disclosure relates to a decoration element and a method for preparing the same. In particular, the present disclosure relates to a decoration element suitable to be used in mobile devices or electronic products, and a method for preparing the same.

BACKGROUND ART

For mobile phones, various mobile devices and electronic products, product designs such as colors, shapes and patterns play a major role in providing values of products to customers in addition to product functions. Product preferences and prices are also dependent on designs.

As for mobile phones as one example, various colors and color senses are obtained using various methods and used in products. A method of providing colors to a mobile phone case material itself or a method of providing designs by attaching a deco film implementing colors and shapes to a case material may be included.

In existing deco films, attempts have been made to develop colors through methods such as printing and deposition. When expressing heterogeneous colors on a single surface, printing needs to be conducted two or more times, and implementation is hardly realistic when to apply various colors to a three-dimensional pattern. In addition, existing deco films have fixed colors depending on a viewing angle, and even when there is a slight change, the change is limited to just a difference in the color sense.

DISCLOSURE

Technical Problem

The present disclosure is directed to providing a decoration element capable minimizing a radio frequency (RF) reception interference factor caused by electro-magnetic (EMI) shielding properties as well as readily obtaining various colors due to a laminated structure of a light reflective layer and a light absorbing layer.

Technical Solution

One embodiment of the present application provides a decoration element comprising a light reflective layer; and a light absorbing layer provided on the light reflective layer, wherein the light absorbing layer has surface resistance of 20 ohm/square or greater.

According to another embodiment of the present application, a material of the light absorbing layer has specific resistance of $2 \times 10^{-4}$ ohm*cm or greater.

According to another embodiment of the present application, the light absorbing layer has surface resistance of 1 giga-ohm/square or greater.

According to another embodiment of the present application, the decoration element has surface resistance of 20 ohm/square or greater.

According to another embodiment of the present application, the decoration element has surface resistance of 1 giga-ohm/square or greater.

According to another embodiment of the present application, the light reflective layer has surface resistance of 20 ohm/square or greater.

According to another embodiment of the present application, the light reflective layer has surface resistance of 1 giga-ohm/square or greater.

According to another embodiment of the present application, a color film is further provided on a surface opposite to the surface facing the light absorbing layer of the light reflective layer; between the light reflective layer and the light absorbing layer; or on a surface opposite to the surface facing the light reflective layer of the light absorbing layer. The color film employs a color difference $\Delta E^*ab$, a distance in space of $L^*a^*b^*$ in a color coordinate CIE $L^*a^*b^*$ of a color absorbing layer, to be greater than 1 when the color film is present compared to when the color film is not provided.

According to another embodiment of the present application, a substrate is provided on a surface opposite to the surface facing the light absorbing layer of the light reflective layer; or on a surface opposite to the surface facing the light reflective layer of the light absorbing layer. For example, when the substrate is provided on a surface opposite to the surface facing the light absorbing layer of the light reflective layer and the color film is located on a surface opposite to the surface facing the light absorbing layer of the light reflective layer, the color film may be provided between the transparent substrate and the light reflective layer; or on a surface opposite to the surface facing the light reflective layer of the transparent substrate. As another example, when the substrate is provided on a surface opposite to the surface facing the light reflective layer of the light absorbing layer and the color film is located on a surface opposite to the surface facing the light reflective layer of the light absorbing layer, the color film may be provided between the transparent substrate and the light absorbing layer; or on a surface opposite to the surface facing the light absorbing layer of the transparent substrate.

According to another embodiment of the present application, the light absorbing layer comprises two or more points with different thicknesses.

According to another embodiment of the present application, the light absorbing layer comprises two or more regions with different thicknesses.

According to another embodiment of the present application, the light absorbing layer comprises one or more regions in which an upper surface has an inclined surface with an inclined angle of greater than 0 degrees and less than or equal to 90 degrees, and the light absorbing layer comprises one or more regions having a thickness different from a thickness in any one region having the inclined surface.

According to another embodiment of the present application, the light absorbing layer comprises one or more regions with a gradually changing thickness.

According to another embodiment of the present application, the light absorbing layer comprises one or more regions in which an upper surface has an inclined surface with an inclined angle of greater than 0 degrees and less than or equal to 90 degrees, and at least one region having the inclined surface has a structure in which a thickness of the light absorbing layer gradually changes.

According to another embodiment of the present application, the light absorbing layer has an extinction coefficient (k) value of greater than 0 and less than or equal to 4, preferably 0.01 to 4 at 400 nm.

According to another embodiment of the present application, the decoration element is a deco film, a case of a mobile device, a case of an electronic product, or a commodity requiring color decoration.

Advantageous Effects

According to embodiments described in the present specification, light absorption occurs in each of an entering path when external light enters through a color absorbing layer and in a reflection path when reflected, and since external light is reflected on each of the light absorbing layer surface and a light reflective layer surface, constructive interference and destructive interference phenomena occur between reflected light on the light absorbing layer surface and reflected light on the light reflective layer surface. Specific colors may be developed through such light absorption in the entering path and the reflection path, and the constructive interference and destructive interference phenomena. In addition, since developed colors are thickness dependent, colors may vary depending on thicknesses even when having the same material composition. In addition thereto, by using a light reflective layer having surface resistance within a specific range as the light absorbing layer in the laminated structure of the light reflective layer and the light absorbing layer, interference with radio frequency (RF) reception caused by electro-magnetic (EMI) shielding properties is minimized, and inhibiting functions of electronic devices using the decoration element can be prevented.

DESCRIPTION OF DRAWINGS

FIG. 1 is a mimetic diagram for describing a working principle of color development in a light reflective layer and light absorbing layer structure.

FIG. 2 shows surface resistance-dependent electro-magnetic wave shielding properties.

FIG. 3 to FIG. 6 illustrate a laminated structure of a decoration element according to embodiments of the present application.

FIG. 7 to FIG. 10 illustrate an upper surface structure of a light absorbing layer of a decoration element according to embodiments of the present application.

FIG. 11 to FIG. 14 illustrate a laminated structure of a decoration element according to embodiments of the present disclosure.

FIG. 15 illustrates properties of aluminum oxynitride capable of being used as a light reflective layer material.

FIG. 16 shows light reflectance of indium.

FIG. 17 is a diagram showing a method of discriminating a light absorbing layer and a light reflective layer.

MODE FOR DISCLOSURE

Hereinafter, the present disclosure will be described in detail.

In the present specification, a "point" means one position that does not have an area. In the present specification, the expression is used to indicate that a light absorbing layer has two or more points with different thicknesses.

In the present specification, a "region" represents a part having a certain area. For example, when placing the decoration element on the ground so that a light reflective layer is placed at the bottom and the light absorbing layer is placed at the top and dividing both ends of the inclined surface or both ends with the same thickness perpendicular with respect to the ground, the region having an inclined surface means an area divided by the both ends of the inclined surface, and the region with the same thickness means an area divided by the both ends with the same thickness.

In the present specification, a "surface" or "region" may be a flat surface, but is not limited thereto, and a part or all may be a curved surface. For example, structures in which a vertical cross-section shape is a part of an arc of a circle or oval, a wave structure, a zigzag or the like may be included.

In the present specification, an "inclined surface" means, when placing the decoration member on the ground so that a light reflective layer is placed at the bottom and the light absorbing layer is placed at the top, a surface having an angle formed by the upper surface with respect to the ground of greater than 0 degrees and less than or equal to 90 degrees.

In the present specification, a "thickness" of a certain layer means a shortest distance from a lower surface to an upper surface of the corresponding layer.

In the present specification, "or" represents, unless defined otherwise, a case of selectively or all comprising those listed, that is, a meaning of "and/or".

In the present specification, a "layer" means covering 70% or more of an area where the corresponding layer is present. It means covering preferably 75% or more, and more preferably 80% or more.

In the present specification, surface resistance may be measured in accordance with a 4-point probe method using a known sheet resistor. As for the surface resistance, a resistance value (V/I) is measured by measuring a current (I) and voltage (V) using 4 probes, and by using an area (unit area, W) of a sample and a distance (L) between electrodes for measuring resistance, surface resistance is obtained (V/I×W/L), and then, a resistive corrector factor (RCF) is multiplied thereby to calculate as ohm/square, a surface resistance unit. The resistive corrector factor may be calculated using a sample size, a sample thickness and a temperature at the time of measurement, and may be calculated using the Poisson's equation. Surface resistance of the whole laminate may be measured and calculated from the laminate itself, and surface resistance of each layer may be measured before forming layers formed with remaining materials other than a target layer to measure from the whole laminate, may be measured after removing layers formed with remaining materials other than a target layer to measure from the whole laminate, or may be measured by analyzing materials of a target layer and then forming a layer under the same condition as the target layer.

A decoration element according to one embodiment of the present application comprises a light reflective layer; and a light absorbing layer provided on the light reflective layer, wherein the light absorbing layer has surface resistance of 20 ohm/square or greater. In such a structure, the decoration member may develop specific colors when observing from the light absorbing layer side.

The light absorbing layer has surface resistance of preferably 80 ohm/square or greater, 100 ohm/square or greater, preferably 500 ohm/square or greater, preferably 5,000 ohm/square or greater, more preferably 10,000 ohm/square or greater, most preferably 1 giga-ohm/square or greater, and more preferably 4 giga-ohm/square or greater.

According to one embodiment, the light absorbing layer may have surface resistance of maximally 10 giga-ohm/square.

Surface resistance of the light absorbing layer may be determined by materials forming the light absorbing layer, or a thickness or a structure of the light absorbing layer. For example, a high-resistance light absorbing layer may be obtained by choosing materials having high surface resistance as the materials forming the light absorbing layer, or by decreasing a thickness of the light absorbing layer. As the material, metal materials having high specific resistance may be used, or surface resistance of the light absorbing layer may be increased by adjusting a partial pressure of $N_2$ or $O_2$ using a reactive process and doping the nitrogen, the oxygen, or these to the metal when forming the light absorbing layer.

According to another embodiment of the present application, the light absorbing layer material has specific resistance of $2\times10^{-4}$ ohm*cm or greater, preferably $1\times10^{-3}$ ohm*cm or greater, more preferably 10 ohm*cm or greater, and most preferably $10^4$ ohm*cm or greater.

According to one embodiment, the light absorbing layer may comprise the material having high resistance while having an extinction coefficient (k) of greater than 0 and less than or equal to 4, preferably an extinction coefficient (k) of 0.01 to 4 at 400 nm, preferably at 380 nm to 780 nm. For example, the light absorbing layer may comprise one, two or more selected from the group consisting of metals, metalloids, and oxides, nitrides, oxynitrides and carbides of metals or metalloids. The oxides, nitrides, oxynitrides or carbides of metals or metalloids may be formed under a deposition condition and the like set by those skilled in the art. The light absorbing layer may also comprise the same metals, metalloids, alloys or oxynitrides of two or more types as the light reflective layer.

For example, the light absorbing layer may be a single layer or a multilayer comprising one, two or more types of materials selected from among indium (In), tin (Sn), silicon (Si), copper (Cu), germanium (Ge), aluminum (Al), nickel (Ni), vanadium (V), tungsten (W), tantalum (Ta), molybdenum (Mo), neodymium (Nd), titanium (Ti), iron (Fe), chromium (Cr), cobalt (Co), gold (Au) and silver (Ag), or oxides, nitrides or oxynitrides thereof. For example, the light absorbing layer may comprise alloys of two or more selected from among the above-mentioned materials, or oxides, nitrides or oxynitrides thereof. The light absorbing layer comprises one, two or more types selected from among copper oxides, copper nitrides, copper oxynitrides, aluminum oxides, aluminum nitrides, aluminum oxynitrides and molybdenum titanium oxynitrides.

According to one embodiment, the light absorbing layer comprises silicon (Si) or germanium (Ge).

The light absorbing layer formed with silicon (Si) or germanium (Ge) may have a refractive index (n) of 0 to 8, or 0 to 7 at 400 nm, and may have an extinction coefficient (k) of greater than 0 and less than or equal to 4, preferably 0.01 to 4, and the extinction coefficient (k) may be from 0.01 to 3 or from 0.01 to 1.

According to another embodiment, the light absorbing layer comprises one, two or more types selected from among copper oxides, copper nitrides, copper oxynitrides, aluminum oxides, aluminum nitrides, aluminum oxynitrides and molybdenum titanium oxynitrides. In this case, the light absorbing layer may have a refractive index (n) of 1 to 3, for example, 2 to 2.5 at 400 nm, and an extinction coefficient (k) of greater than 0 and less than or equal to 4, preferably 0.01 to 2.5, preferably 0.2 to 2.5, and more preferably 0.2 to 0.6.

According to one embodiment, the light absorbing layer is AlOxNy (x>0, y>0).

According to another embodiment, the light absorbing layer may be AlOxNy (0≤x≤1.5, 0≤y≤1).

According to another embodiment, the light absorbing layer is AlOxNy (x>0, y>0), and with respect to the total number of atoms 100%, the number of each atom satisfies the following equation.

$$1 < \frac{(Al)at \times 3}{(O)at \times 2 + (N)at \times 3} < 2$$

According to one embodiment, the light absorbing layer may be formed with materials having an extinction coefficient (k) at 400 nm, preferably at 380 nm to 780 nm.

According to another embodiment of the present application, the light reflective layer has surface resistance of 20 ohm/square or greater.

The light reflective layer has surface resistance of preferably 100 ohm/square or greater, preferably 500 ohm/square or greater, preferably 5,000 ohm/square or greater, more preferably 10,000 ohm/square or greater, most preferably 1 giga-ohm/square or greater, and more preferably 4 giga-ohm/square or greater.

According to one embodiment, the light reflective layer may have surface resistance of maximally 10 giga-ohm/square.

Surface resistance of the light reflective layer may be determined by materials forming the light reflective layer or a thickness of the light reflective layer. For example, a high-resistance light reflective layer may be obtained by choosing materials having high surface resistance as the materials forming the light reflective layer, or by decreasing a thickness of the light reflective layer. As the material, metal materials having high specific resistance may be used, or surface resistance of the light reflective layer may be increased by adjusting a partial pressure of $N_2$ or $O_2$ using a reactive process and doping the nitrogen, the oxygen, or these to the metal when forming the light reflective layer.

According to another embodiment of the present application, the light reflective layer material has specific resistance of $2\times10^{-4}$ ohm*cm or greater, preferably $1\times10^{-3}$ ohm*cm or greater, more preferably 10 ohm*cm or greater, and most preferably $10^4$ ohm*cm or greater.

Metal materials may be generally used for light reflection properties of the light reflective layer, however, metal materials such as aluminum have high electrical conductivity. This may interfere with RF reception due to electro-magnetic wave shielding properties when used in electronic devices such as mobile devices such as mobile phones. However, according to the above-mentioned embodiment, interference with RF reception may be minimized due to high surface resistance as a light reflective layer.

The light reflective layer is not particularly limited as long as it is a material capable of reflecting light, and capable of having the surface resistance described above in a given thickness or structure of the light reflective layer. Light reflectance may be determined depending on the material, and for example, colors are readily expressed at 50% or greater. Light reflectance may be measured using an ellipsometer.

As one example, the light reflective layer may be a single layer or a multilayer comprising one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof, and one, two or more types of materials among carbon and carbon composites. For example, the light reflective layer may comprise two or more alloys selected from among the above-mentioned materials, or oxides, nitrides or oxynitrides thereof. According to another embodiment, the light reflective layer may allow highly resistant reflective layer by being prepared using an ink comprising carbon or carbon composites. Carbon black, CNT and the like may be included as the carbon or carbon composites. The ink comprising carbon or carbon composites may comprise above-described materials, or oxides, nitrides or oxynitrides thereof, and for example, one, two or more types of oxides selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag) may be included. A curing process may be further carried out after printing the ink comprising carbon or carbon composites.

When the light reflective layer comprises two or more types of materials, the two or more types of materials may be formed using one process, for example, a method of deposition or printing, however, a method of first forming a layer using one or more types of materials, and then additionally forming a layer thereon using one or more types of materials may be used. For example, a light reflective layer may be formed by forming a layer through depositing indium or tin, then printing an ink comprising carbon, and then curing the result. The ink may further comprise oxides such as titanium oxides or silicon oxides.

According to another embodiment of the present application, the whole decoration element comprising the light reflective layer and the light absorbing layer may have surface resistance of 20 ohm/square or greater, 80 ohm/square or greater, 100 ohm/square or greater, preferably 500 ohm/square or greater, preferably 5,000 ohm/square or greater, more preferably 10,000 ohm/square or greater, most preferably 1 giga-ohm/square or greater, and more preferably 4 giga-ohm/square or greater.

For example, when using aluminum oxynitride as a material of the light reflective layer, the following relation may be satisfied by having a composition of aluminum (Al) 57 at % to 60 at %, oxygen (O) 1 at % to 5 at % and nitrogen 37 at % to 42 at % in the layer. As a specific example, the value of the following relation may be from 1.4 to 1.5. More specifically, the material of FIG. 15 may be used as a material of the light reflective layer. The $N_2$ flow rate of FIG. 15 represents a flow rate of reactive gas $N_2$ used for forming the aluminum oxynitride, and the color is a result of simulating the color observed from the light reflective layer.

Relation:

$$1 < \frac{(Al)at \times 3}{(O)at \times 2 + (N)at \times 3} < 2$$

The light absorbing layer preferably has a refractive index (n) of 0 to 8 at 400 nm, and the refractive index may be from 0 to 7, may be from 0.01 to 3, and may be from 2 to 2.5. The refractive index (n) may be calculated by $\sin \theta_1/\sin \theta_2$ ($\theta_1$ is an angle of light incident on a surface of the light absorbing layer, and $\theta_2$ is a refraction angle of light inside the light absorbing layer).

The light absorbing layer preferably has a refractive index (n) of 0 to 8 at 380 nm to 780 nm, and the refractive index may be from 0 to 7, may be from 0.01 to 3, and may be from 2 to 2.5.

The light absorbing layer may have an extinction coefficient (k) of greater than 0 and less than or equal to 4, preferably 0.01 to 4, at 400 nm, and the extinction coefficient (k) may be from 0.01 to 3.5, may be from 0.01 to 3, and may be from 0.1 to 1. The extinction coefficient (k) is $-\lambda/4\pi I$ (dI/dx) (herein, a value multiplying $\lambda/4n$ with dI/I, a reduced fraction of light intensity per a path unit length (dx), for example 1 m, in the light absorbing layer, and herein, $\lambda$ is a wavelength of light).

The light absorbing layer may have an extinction coefficient (k) of greater than 0 and less than or equal to 4, preferably 0.01 to 4, at 380 nm to 780 nm, and the extinction coefficient (k) may be from 0.01 to 3.5, may be from 0.01 to 3, and may be from 0.1 to 1.

The extinction coefficient (k) is in the above-mentioned range at 400 nm, preferably in the whole visible wavelength region of 380 nm to 780 nm, and therefore, a role of the light absorbing layer may be performed in the visible range. Even when having the same refractive index (n) value, a difference of $\Delta E^*ab=\sqrt{\{(\Delta L)^2+(\Delta a)^2+(\Delta b)^2\}}>1$ may be obtained when the extinction coefficient (k) value is 0 and when the extinction coefficient (k) value is 0.01 at 400 nm. For example, when simulating a case of irradiating D65 (solar spectrum) as a light source on a laminated structure of glass/light reflective layer/light absorbing layer/air layer, E*ab values when the k values of the light absorbing layer are 0 and 0.01 are obtained as in the following Tables 1 and 2. Table 1 uses high-resistance indium as the light reflective layer material, and Table 2 uses low-resistance aluminum as the light reflective layer material. Herein, the thickness (h1) of the light reflective layer is 120 nm, and the thickness (h2) of the light absorbing layer is described in the following Tables 1 and 2. The k values are arbitrarily set at 0 and 0.01 for the simulation, and as the n value, the value of indium or aluminum is used.

TABLE 1

| | k = 0 | | | k = 0.01 | | | |
|---|---|---|---|---|---|---|---|
| h2 [nm] | L | A | B | L | A | b | ΔE*ab |
| 40 | 52.17 | 8.8 | −16.01 | 51.08 | 9.1 | −15.75 | 1.16 |
| 60 | 57.52 | 2.98 | −20.25 | 56.26 | 3.19 | −20.39 | 1.29 |
| 80 | 64.38 | −1.37 | −17.22 | 63.12 | −1.33 | −17.52 | 1.3 |

Table 1 corresponds to a case using high-resistance indium as the light reflective layer material.

TABLE 2

| h2 [nm] | k = 0 | | | k = 0.01 | | | ΔE*ab |
|---|---|---|---|---|---|---|---|
| | L | A | b | L | A | b | |
| 40 | 86.63 | 1.75 | −1.25 | 85.18 | 2.09 | 0.03 | 1.96 |
| 60 | 89.83 | −4.02 | −8.30 | 87.86 | −4.06 | −9.01 | 2.10 |
| 80 | 95.60 | −1.87 | −2.58 | 94.44 | −2.05 | −2.86 | 1.20 |

Table 2 corresponds to a case using low-resistance aluminum as the light reflective layer material.

For example, using a method of absorbing light by adding a dye to a resin, and using a material having an extinction coefficient as described above lead to different light absorption spectra. When absorbing light by adding a dye to a resin, an absorption wavelength band is fixed, and only a phenomenon of varying an absorption amount depending on the changes in the coating thickness occurs. In addition, in order to obtain a target light absorption amount, changes in the thickness of at least a few micrometers or more are required to adjust the light absorption amount. On the other hand, in materials having an extinction coefficient, a wavelength band absorbing light changes even when the thickness changes by a several to tens of nanometer scale.

According to one embodiment, the thickness of the light reflective layer may be determined depending on target color in a final structure, and for example, may be 1 nm or greater, preferably 25 nm or greater, for example, 50 nm or greater, and preferably 70 nm or greater. According to one embodiment, the light reflective layer has a thickness of greater than or equal to 1 nm and less than 50 nm.

According to one embodiment, the thickness of the light absorbing layer may be from 5 nm to 500 nm, for example, from 30 nm to 500 nm.

According to one embodiment, a difference in the thickness by the region of the light absorbing layer is from 2 nm to 200 nm, and may be determined depending on a target color difference.

According to another embodiment of the present application, a color film is further provided on a surface opposite to the surface facing the light absorbing layer of the light reflective layer; between the light reflective layer and the light absorbing layer; or on a surface opposite to the surface facing the light reflective layer of the light absorbing layer. When a transparent substrate is provided on the light reflective layer side, the color film may be provided between the light reflective layer and the transparent substrate; or on a surface opposite to the surface facing the light reflective layer of the transparent substrate.

When the color film is present compared to when the color film is not provided, the color film is not particularly limited as long as it has a color difference ΔE*ab, a distance in space of L*a*b* in a color coordinate CIE L*a*b* of the color absorbing layer, being greater than 1.

Colors may be expressed by CIE L*a*b*, and a color difference may be defined using a distance (ΔE*ab) in the L*a*b* space. Specifically, the color difference is ΔE*ab=√{(ΔL)²+(Δa)²+(Δb)²}, and within a range of 0<ΔE*ab<1, an observer may not recognize the color difference [reference document: Machine Graphics and Vision 20(4):383-411]. Accordingly, a color difference obtained by the color film addition may be defined by ΔE*ab>1 in the present specification.

FIG. 11(a) illustrates a structure in which a light reflective layer (201), a light absorbing layer (301) and a color film (401) are consecutively laminated, FIG. 11(b) illustrates a structure in which a light reflective layer (201), a color film (401) and a light absorbing layer (301) are consecutively laminated, and FIG. 11(c) illustrates a structure in which a color film (401), a light reflective layer (201) and a light absorbing layer (301) are consecutively laminated.

The color film may also perform a role of a substrate. For example, those that may be used as a substrate may be used as a color film by adding a pigment or a dye thereto.

The substrate may be provided on a surface opposite to the surface facing the light absorbing layer of the light reflective layer; or on a surface opposite to the surface facing the light reflective layer of the light absorbing layer. FIG. 12(a) illustrates an example of the substrate being provided on a surface opposite to the surface facing the light absorbing layer of the light reflective layer, and FIG. 12(b) illustrates an example of the substrate being provided on a surface opposite to the surface facing the light reflective layer of the light absorbing layer.

For example, when the substrate is provided on a surface opposite to the surface facing the light absorbing layer of the light reflective layer and the color film is located on a surface opposite to the surface facing the light absorbing layer of the light reflective layer, the color film may be provided between the substrate and the light reflective layer; or on a surface opposite to the surface facing the light reflective layer of the substrate. As another example, when the substrate is provided on a surface opposite to the surface facing the light reflective layer of the light absorbing layer and the color film is located on a surface opposite to the surface facing the light reflective layer of the light absorbing layer, the color film may be provided between the substrate and the light absorbing layer; or on a surface opposite to the surface facing the light absorbing layer of the substrate.

According to another embodiment of the present application, the substrate is provided on a surface opposite to the surface facing the light absorbing layer of the light reflective layer, and the color film is further provided. FIG. 13(a) illustrates a structure in which the color film (401) is provided on a surface opposite to the light reflective layer (201) side of the light absorbing layer (301), FIG. 13(b) illustrates a structure in which the color film (401) is provided between the light absorbing layer (301) and the light reflective layer (201), FIG. 13(c) illustrates a structure in which the color film (401) is provided between the light reflective layer (201) and the substrate (101), and FIG. 13(d) illustrates a structure in which the color film (401) is provided on a surface opposite to the light reflective layer (201) side of the substrate (101). FIG. 13(e) illustrates a structure in which the color films (401a, 401b, 401c, 401d) are provided on a surface opposite to the light reflective layer (201) side of the light absorbing layer (301), between the light absorbing layer (301) and the light reflective layer (201), between the light reflective layer (201) and the substrate (101), and on a surface opposite to the light reflective layer (201) side of the substrate (101), respectively, however, the structure is not limited thereto, and 1 to 3 of the color films (401a, 401b, 401c, 401d) may not be included.

According to another embodiment of the present application, the substrate is provided on a surface opposite to the surface facing the light reflective layer of the light absorbing layer, and the color film is further provided. FIG. 14(a) illustrates a structure in which the color film (401) is provided on a surface opposite to the light absorbing layer (301) side of the substrate (101), FIG. 14(b) illustrates a structure in which the color film (401) is provided between the substrate (101) and the light absorbing layer (301), FIG. 14(c) illustrates a structure in which the color film (401) is provided between the light absorbing layer (301) and the light reflective layer (201), and FIG. 14(d) illustrates a structure in which the color film (401) is provided on a surface opposite to the light absorbing layer (301) side of the light reflective layer (201). FIG. 14(e) illustrates a structure in which the color films (401a, 401b, 401c, 401d) are provided on a surface opposite to the light absorbing layer (201) side of the substrate (101), between the substrate (101) and the light absorbing layer (301), between the light absorbing layer (301) and the light reflective layer (201), and on a surface opposite to the light absorbing layer (201) side of the light reflective layer (201), respectively, however, the structure is not limited thereto, and 1 to 3 of the color films (401a, 401b, 401c, 401d) may not be included.

In the structures such as FIG. 13(b) and FIG. 14(c), the light reflective layer may reflect light entering through the color film when the color film has visible light transmittance of greater than 0%, and therefore, colors may be obtained by laminating the light absorbing layer and the light reflective layer.

In the structures such as FIG. 13(c), FIG. 13(d) and FIG. 14(d), light transmittance of the colors developed from the color film of the light reflective layer (201) may be 1% or greater, preferably 3% or greater and more preferably 5% or greater so that changes in the color difference obtained by the color film addition may be recognized. This is due to the fact that light transmitted in such a light transmittance range may be mixed with colors obtained by the color film.

The color film may be provided as one sheet, or as a laminate of 2 sheets or more that are the same or different types.

As the color film, those capable of developing target colors by combining with colors developed from the laminated structure of the light reflective layer and the light absorbing layer described above may be used. For example, color films expressing colors by one, two or more types of pigments and dyes being dispersed into a matrix resin may be used. Such a color film may be formed by directly coating a composition for forming a color film on a color film-providable location, or a method of preparing a color film by coating a composition for forming a color film on a separate substrate or using a known molding method such as casting or extrusion, and then disposing or attaching the color film on a color film-providable location may be used.

The pigment and the dye capable of being included in the color film may be selected from among those capable of obtaining target colors from a final decoration member, and known in the art, and one, two or more types among pigments and dyes such as red-based, yellow-based, purple-based, blue-based or pink-based may be used. Specifically, dyes such as perinone-based red dyes, anthraquinone-based red dyes, methane-based yellow dyes, anthraquinone-based yellow dyes, anthraquinone-based purple dyes, phthalocyanine-based blue dyes, thioindigo-based pink dyes or isoxindigo-based pink dyes may be used either alone or as a combination. Pigments such as carbon black, copper phthalocyanine (C.I. Pigment Blue 15:3), C.I. Pigment Red 112, Pigment blue or isoindoline yellow may be used either alone or as a combination. As such dyes or pigments, those commercially available may be used, and for example, materials manufactured by Ciba ORACET or Chokwang Paint Ltd. may be used. Types of the dyes or pigments and colors thereof are for illustrative purposes only, and various known dyes or pigments may be used, and more diverse colors may be obtained therefrom.

As the matrix resin included in the color film, materials known as materials of transparent films, primer layers, adhesive layers or coating layers may be used, and the matrix resin is not particularly limited to these materials. For example, various materials such as acryl-based resins, polyethylene terephthalate-based resins, urethane-based resins, linear olefin-based resins, cycloolefin-based resins, epoxy-based resins or triacetylcellulose-based resins may be selected, and copolymers or mixtures of the materials illustrated above may also be used.

When the color film is disposed closer to the location observing a decoration member than the light reflective layer or the light absorbing layer as in, for example, the structures of FIGS. 13(a) and (b), and FIGS. 14(a), (b) and (c), light transmittance of the colors developed by the color film from the light reflective layer, the light absorbing layer or the laminated structure of the light reflective layer and the light absorbing layer may be 1% or greater, preferably 3% or greater and more preferably 5% or greater. As a result, target colors may be obtained by combining colors developed from the color film and colors developed from the light reflective layer, the light absorbing layer or the laminated structure thereof.

The thickness of the color film is not particularly limited, and those skilled in the art may select and set the thickness as long as it is capable of obtaining target colors. For example, the color film may have a thickness of 500 nm to 1 mm.

According to another embodiment of the present application, when the light absorbing layer comprises a pattern, the pattern may have a symmetric structure, an asymmetric structure or a combination thereof.

According to one embodiment, the light absorbing layer may comprise a symmetric-structured pattern. As the symmetric structure, a prism structure, a lenticular lens structure and the like are included.

In the present specification, the asymmetric-structured pattern means having an asymmetric structure on at least one surface when observing from an upper surface, a side surface or a cross-section. The decoration member may develop dichroism when having such an asymmetric structure. Dichroism means different colors being observed depending on a viewing angle.

Dichroism may be expressed by $\Delta E^*ab=\sqrt{\{(\Delta L)^2+(\Delta a)^2+(\Delta b)^2\}}$ relating to the color difference described above, and a viewing angle-dependent color difference being $\Delta E^*ab>1$ may be defined as having dichroism.

According to one embodiment, the light absorbing layer may have dichroism of $\Delta E^*ab>1$.

According to one embodiment, an upper surface of the light absorbing layer may comprise a pattern having a cone-shaped protrusion or groove, a pattern having a protrusion in which the highest point has a line shape or a groove in which the lowest point has a line shape, or a pattern having a protrusion or groove with a structure in which the cone-shaped upper surface is cut.

According to one embodiment, the light absorbing layer comprises a pattern in which an upper surface has a cone-shaped protrusion or groove. The cone shape comprises a shape of a circular cone, an oval cone or a polypyramid. Herein, the shape of the bottom surface of the polypyramid comprises a triangle, a square, a star shape having 5 or more protruding points, and the like. The cone shape may have a shape of a protrusion formed on an upper surface of the light absorbing layer, or a shape of a groove formed on an upper surface of the light absorbing layer. The protrusion has a triangular cross-section, and the groove has an inverted triangular cross-section. A lower surface of the light absorbing layer may also have the same shape as the upper surface of the light absorbing layer.

According to one embodiment, the cone-shaped pattern may have an asymmetric structure. For example, when rotating the cone-shaped pattern 360 degrees based on the vertex of the cone and observing from the upper surface, dichroism is difficult to be developed from the pattern when three or more same shapes are present. However, when rotating the cone-shaped pattern 360 degrees based on the vertex of the cone and observing from the upper surface, dichroism may be developed when two or less same shapes are present. FIG. 7 illustrates an upper surface of the cone shape, and (a) all illustrates a symmetric-structured cone shape, and (b) illustrates an asymmetric-structured cone shape.

The symmetric-structured cone shape has a structure in which a cone-shaped bottom surface is a circle or a regular polygon having the same side lengths, and the vertex of the cone is present on a vertical line of the center of gravity of the bottom surface. However, the asymmetric-structured cone shape has a structure in which, when observing from the upper surface, the position of the vertex of the cone is present on a vertical line of a point that is not the center of gravity of the bottom surface, or has a structure in which the bottom surface is an asymmetric-structured polygon or oval. When the bottom surface is an asymmetric-structured polygon, at least one of the sides and the angles of the polygon may be designed to be different from the rest.

For example, as in FIG. 8, the position of the vertex of the cone may be changed. Specifically, when designing the vertex of the cone to be located on a vertical line of the center of gravity (O1) of the bottom surface when observing from the upper surface as in the first drawing of FIG. 8, 4 identical structures may be obtained when rotating 360 degrees based on the vertex of the cone (4-fold symmetry). However, the symmetric structure is broken by designing the vertex of the cone on a position (O2) that is not the center of gravity (O1) of the bottom surface. When employing a length of one side of the bottom surface as x, migration distances of the vertex of the cone as a and b, a height of the cone shape, a length of a line vertically connecting from the vertex of the cone (O1 or O2) to the bottom surface, as h, and an angle formed by the bottom surface and a side surface of the cone as θn, cosine values for Surface 1, Surface 2, Surface 3 and Surface 4 of FIG. 8 may be obtained as follows.

$$\cos(\Theta 1) = \frac{\left(\frac{x}{2}\right)}{\sqrt{h^2 + \left(\frac{x}{2}\right)^2}} \quad \cos(\Theta 3) = \frac{\left(\frac{x}{2} - a\right)}{\sqrt{h^2 + \left(\frac{x}{2} - a\right)^2}}$$

$$\cos(\Theta 2) = \frac{\left(\frac{x}{2}\right)}{\sqrt{h^2 + \left(\frac{x}{2}\right)^2}} \quad \cos(\Theta 4) = \frac{\left(\frac{x}{2} - b\right)}{\sqrt{h^2 + \left(\frac{x}{2} - b\right)^2}}$$

Herein, θ1 and θ2 are the same, and therefore, there is no dichroism. However, θ3 and θ4 are different, and |θ3−θ4| means a color difference between two colors (E*ab), and therefore, dichroism may be obtained. Herein, θ3−θ4>0. As above, how much the symmetric structure is broken, that is, a degree of asymmetry, may be represented quantitatively using an angle formed by the bottom surface and a side surface of the cone, and the value representing such a degree of asymmetry is proportional to a color difference of dichroism.

According to another embodiment, the light absorbing layer comprises a pattern having a protrusion in which the highest point has a line shape or a groove in which the lowest point has a line shape. The line shape may be a straight-line shape or a curved-line shape, and may comprise both a curved line and a straight line. When rotating the pattern having a line-shaped protrusion or groove 360 degrees based on the center of gravity of an upper surface and observing from the upper surface, dichroism is difficult to be developed when two or more same shapes are present. However, when rotating the pattern having a line-shaped protrusion or groove 360 degrees based on the center of gravity of an upper surface and observing from the upper surface, dichroism may be developed when only one same shape is present. FIGS. 9(a) and 9(b) illustrate an upper surface of a pattern having a line-shaped protrusion. FIG. 9(a) illustrates a pattern having a line-shaped protrusion developing no dichroism and FIG. 9(b) illustrates a pattern having a line-shaped protrusion developing dichroism. An X-X' cross-section of FIG. 9(a) is an isosceles triangle or an equilateral triangle, and a Y-Y' cross-section of FIG. 9(b) is a triangle having different side lengths.

According to another embodiment, the light absorbing layer comprises a pattern in which an upper surface has a protrusion or groove with a structure in which the cone-shaped upper surface is cut. Such a cross-section of the pattern may have a trapezoidal or inversed trapezoidal shape. In this case, dichroism may also be developed by designing the upper surface, the side surface or the cross-section to have an asymmetric structure.

In addition to the structure illustrated above, various protrusion or groove patterns as in FIG. 10 may be obtained.

According to another embodiment of the present application, the light absorbing layer may comprise two or more regions with different thicknesses.

According to the embodiments, light absorption occurs in an entering path and a reflection path of light in the light absorbing layer, and by the light reflecting on each of a surface of the light absorbing layer and an interface of the light absorbing layer and the light reflective layer, the two reflected lights go through constructive or destructive interference. In the present specification, the light reflected on the surface of the light absorbing layer may be expressed as surface reflected light, and the light reflected on the interface of the light absorbing layer and the light reflective layer may be expressed as interface reflected light. FIG. 1 and FIG. 3 illustrate a mimetic diagram of such a working principle. In FIG. 3, a substrate is provided at the bottom of the light reflective layer, however, it is not required.

Through FIG. 17, the light absorbing layer and the light reflective layer are described. In the decoration element of FIG. 17, each layer is laminated in order of a $L_{i-1}$ layer, a $L_i$ layer and a $L_{i+1}$ layer based on a light entering direction, an interface $I_i$ is located between the $L_{i-1}$ layer and the $L_i$ layer, and an interface $I_{i+1}$ is located between the $L_i$ layer and the $L_{i+1}$ layer.

When irradiating light having a specific wavelength in a direction perpendicular to each layer so that thin film interference does not occur, reflectance at the interface $I_i$ may be expressed by the following Mathematical Equation 1.

$$\frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \quad \text{[Mathematical Equation 1]}$$

In Mathematical Equation 1, $n_i(\lambda)$ means a refractive index depending on the wavelength ($\lambda$) of the $i^{th}$ layer, and $k_i(\lambda)$ means an extinction coefficient depending on the wavelength ($\lambda$) of the $i^{th}$ layer. The extinction coefficient is a measure capable of defining how strongly a subject material absorbs light at a specific wavelength, and the definition is as described above.

Using Mathematical Equation 1, when a sum of reflectance for each wavelength at the interface $I_i$ calculated at each wavelength is $R_i$, $R_i$ is as in the following Mathematical Equation 2.

$$R_i = \frac{\sum_{\lambda=380\,nm}^{\lambda=780\,nm} \frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \Delta\lambda}{\sum_{\lambda=380\,nm}^{\lambda=780\,nm} \Delta\lambda} \quad \text{[Mathematical Equation 2]}$$

Examples of the structure according to the embodiment are illustrated in FIG. 3 and FIG. 4. In FIG. 3 and FIG. 4, a light absorbing layer (301) is provided on a light reflective layer (201), and the light absorbing layer has two or more points with different thicknesses. According to FIG. 3, thicknesses in A region and B region are different in the light absorbing layer (301). According to FIG. 4, thicknesses in C region and D region are different in the light absorbing layer (301).

According to another embodiment of the present application, the light absorbing layer comprises one or more regions in which an upper surface has an inclined surface with an inclined angle of greater than 0 degrees and less than or equal to 90 degrees, and the light absorbing layer comprises one or more regions having a thickness different from a thickness in any one region having the inclined surface.

Surface properties such as an upper surface slope of the light reflective layer may be the same as an upper surface of the light absorbing layer. For example, by using a deposition method when forming the light absorbing layer, the upper surface of the light absorbing layer may have the same slope as the upper surface of the light reflective layer.

FIG. 5 illustrates a structure of a decoration element having a light absorbing layer in which an upper surface has an inclined surface. The structure is a structure laminating a substrate (101), a light reflective layer (201) and a light absorbing layer (301), and thickness t1 in E region and thickness t2 in F region are different in the light absorbing layer (301).

FIG. 6 relates to a light absorbing layer having inclined surfaces facing each other, which is, having a structure with a triangle cross-section. In the structure of the pattern having inclined surfaces facing each other as in FIG. 6, a thickness of the light absorbing layer may be different in two surfaces of the triangle structure even when progressing deposition under the same condition. Accordingly, a light absorbing layer having two or more regions with different thicknesses may be formed using just one process. As a result, developed colors may become different depending on the thickness of the light absorbing layer. Herein, the thickness of the light reflective layer does not affect changes in the color when it is a certain thickness or greater.

According to another embodiment of the present application, the light absorbing layer comprises one or more regions with a gradually changing thickness. FIG. 3 illustrates a structure in which a thickness of the light absorbing layer gradually changes.

According to another embodiment of the present application, the light absorbing layer comprises one or more regions in which an upper surface has an inclined surface with an inclined angle of greater than 0 degrees and less than or equal to 90 degrees, and at least one region having the inclined surface has a structure in which a thickness of the light absorbing layer gradually changes. FIG. 6 illustrates a structure of a light absorbing layer comprising a region in which an upper surface has an inclined surface. In FIG. 6, both G region and H region have a structure in which an upper surface of the light absorbing layer has an inclined surface, and a thickness of the light absorbing layer gradually changes.

According to one embodiment, the light absorbing layer comprises a first region having a first inclined surface with an inclined angle in a range of 1 degrees to 90 degrees, and may further comprise a second region in which an upper surface has an inclined surface with a different slope direction or a different inclined angle from the first inclined surface, or an upper surface is horizontal. Herein, thicknesses in the first region and the second region may be different from each other in the light absorbing layer.

According to another embodiment, the light absorbing layer comprises a first region having a first inclined surface with an inclined angle in a range of 1 degrees to 90 degrees, and may further comprise two or more regions in which an upper surface has an inclined surface with a different slope direction or a different inclined angle from the first inclined surface, or an upper surface is horizontal. Herein, thicknesses in the first region and the two or more regions may all be different from each other in the light absorbing layer.

According to one embodiment, a substrate provided on a lower surface of the light reflective layer or an upper surface of the light absorbing layer may be further included. Surface properties such as an upper surface slope of the substrate may be the same as upper surfaces of the light reflective layer and the light absorbing layer. By forming the light reflective layer and the light absorbing layer using a deposition method, the substrate, the light reflective layer and the light absorbing layer may have an inclined surface with the same angle. For example, the structure as above may be obtained by forming an inclined surface or a three-dimensional structure on an upper surface of a substrate, and depositing a light reflective layer and a light absorbing layer thereon in this order, or depositing a light absorbing layer and a light reflective layer in this order.

According to one embodiment, forming an inclined surface or a three-dimensional structure on the substrate surface may be carried out using a method of forming a pattern on an ultraviolet curable resin and curing the result using ultraviolet rays, or processing with laser.

According to one embodiment, the decoration element may be a deco film or a case of a mobile device. The decoration element may further comprise a gluing layer as necessary.

Materials of the substrate are not particularly limited, and ultraviolet curable resins known in the art may be used when forming an inclined surface or a three-dimensional structure using methods as above.

On the light absorbing layer, a protective layer may be further provided.

According to one embodiment, an adhesive layer may be further provided on an opposite surface of the substrate provided with the light absorbing layer or the light reflective layer. This adhesive layer may be an optically clear adhesive (OCA) layer. As necessary, a peel-off layer (release liner) may be further provided on the adhesive layer for protection.

Deposition such as a sputtering method has been described as an example of forming the light reflective layer and the light absorbing layer in the present specification, however, various methods of preparing a thin film may be used as long as constitutions and properties according to embodiments described in the present specification are obtained. For example, a vapor deposition method, a chemical vapor deposition (CVD) method, wet coating and the like may be used.

Hereinafter, the present disclosure will be described in more detail with reference to examples. However, the following examples are for illustrative purposes only, and are not to limit the scope of the present disclosure.

Example and Comparative Example

Using reactive sputtering deposition, an aluminum oxynitride light absorbing layer having a thickness of the following Table 3 was prepared on a color PET film that uses an asymmetric prism (pattern substrate) and a blue primer. The deposition process was progressed under a vacuum condition of a base pressure of $3 \times 10^{-6}$ torr and a process pressure of 3 mtorr, Ar gas was adjusted to 100 sccm, and reactive gas $N_2$ was adjusted as in the following Table 4. The reactive gas partial pressure section was 13.5% to 14%. After depositing the light absorbing layer, indium (In), a light reflective layer, was deposited to a thickness of 30 nm using a non-reactive deposition process (Ar 100%) at the same process pressure (Examples 1 to 3). Aluminum was deposited to a thickness of 100 nm using the same process as above (Comparative Examples 1 to 3).

Surface resistance of the light absorbing layer and surface resistance of the whole laminate herein are as in the following Table 3. As for the surface resistance, surface resistance for the light reflective layers and the light absorbing layers of the examples was measured in accordance with a 4-point probe method using a known surface resistor. Surface resistance of the light absorbing layer was measured prior to forming the light reflective layer. Surface resistance of the whole laminate is determined by resistance of the reflective layer having low surface resistance since the layers are connected in parallel. Specifically, the surface resistance was measured using a measuring device of Hiresta MCP-HT450, ASP PROBE.

Composition and surface resistance of the light absorbing layer are listed in the following Table 4, and an $N_2$ gas flow rate when forming the light absorbing layer, and a refractive index (n) and an extinction coefficient (k) of the light absorbing layer are listed in Table 5. FIG. 16 shows light reflectance of indium.

TABLE 3

| | | Material | Thickness (nm) | Surface Resistance (Ω/□) |
|---|---|---|---|---|
| Comparative Example 1 | Light Reflective Layer | Al | 100 | 0.4 |
| | Light Absorbing Layer | AlON | 40 | 6.8 |
| | Whole Laminate | Al/AlON | 140 | 0.4 |
| Example 1 | Light Reflective Layer | Al | 100 | 0.4 |
| | Light Absorbing Layer | AlON | 40 | 85M |
| | Whole Laminate | Al/AlON | 140 | 0.4 |
| Example 2 | Light Reflective Layer | Al | 100 | 0.4 |
| | Light Absorbing Layer | AlON | 40 | OR |
| | Whole Laminate | Al/AlON | 140 | 0.4 |
| Comparative Example 2 | Light Reflective Layer | Al | 100 | 0.4 |
| | Light Absorbing Layer | AlON | 40 | 8 |
| | Whole Laminate | Al/AlON | 140 | 0.4 |
| Example 3 | Light Reflective Layer | In | 30 | OR |
| | Light Absorbing Layer | AlON | 40 | 85M |
| | Whole Laminate | In/AlON | 140 | OR |
| Example 4 | Light Reflective Layer | In | 30 | OR |
| | Light Absorbing Layer | AlON | 40 | OR |
| | Whole Laminate | In/AlON | 140 | OR |

M: mega-ohm
OR: over range (greater than 1 giga-ohm/□ at 5000 V, which was out of measurement range of the device)

TABLE 4

| | | $AlO_xN_y$ Layer | | |
|---|---|---|---|---|
| | $N_2$ Flow Rate (sccm) | Elemental Content (atomic %) | Relation | Surface Resistance (Ω/□) |
| Comparative Example 1 | 4 | Al: 57.6 ± 0.5<br>O: 5.9 ± 1.3<br>N: 36.5 ± 0.8 | 1.4 | 6.8 |
| Comparative Example 2 | 13.5 | Al: 58.9 ± 0.2<br>O: 1.9 ± 0.3<br>N: 39.2 ± 0.5 | 1.5 | 8M |
| Example 1<br>Example 3 | 13.8 | Al: 59.0 ± 0.6<br>O: 1.7 ± 0.6<br>N: 39.3 ± 0.5 | 1.5 | 85M |
| Example 2<br>Example 4 | 14 | Al: 59.2 ± 0.1<br>O: 1.4 ± 0.7<br>N: 39.4 ± 0.7 | 1.5 | OR |

Relation:

$$1 < \frac{(Al)at \times 3}{(O)at \times 2 + (N)at \times 3} < 2$$

TABLE 5

|  | N₂ Flow Rate (sccm) | n at 400 nm | k at 400 nm |
| --- | --- | --- | --- |
| Examples 2, 4 | 14 | 2.061 | 0.019 |
| Examples 1, 3 | 13.8 | 2.217 | 0.198 |
| Comparative Example 2 | 13.5 | 2.258 | 0.278 |
| Comparative Example 1 | 4 | 2.308 | 0.332 |

As shown in Table 3, it was seen that the light absorbing layer had higher surface resistance in the laminates of Examples 1 to 3 compared to the comparative examples, and based on FIG. 2, it was seen that the function of RF reception was enhanced by decreasing electro-magnetic wave shielding. Particularly, it was identified that the decoration films of Examples 3 and 4 exhibited high resistance of 1 giga-ohm/square or greater when applying 5000 V.

The elemental content measurement in Table 4 is by an XPS analysis method, and specific conditions are as follows.

K-Alpha, Thermo Fisher Scientific Inc
X-ray source: monochromatic Al Kα (1486.6 eV),
X-ray spot size: 300 μm
Ar ion etching: monatomic (1000 eV, high, Raster width: 1.5 mm, sputter rate: 0.18 nm/s)
Operation mode: CAE (Constant Analyzer Energy) mode
Charge compensation: default FG03 mode (250 μA, 1 V)

| Element | Scan Range | Step Size | Per Point Dwell Time | Number of Scan | Pass Energy |
| --- | --- | --- | --- | --- | --- |
| Narrow (Snapshot) | 20.89 eV | 0.1 eV | 1 s | 10 | 150 eV |
| Survey | 10 eV to 1,350 eV | 1 eV | 10 ms | 10 | 200 eV |

*Peak background: use smart method

The invention claimed is:

1. A decoration element comprising:
a light reflective layer; and
a light absorbing layer provided on the light reflective layer,
wherein the light absorbing layer has a surface resistance of 20 ohm/square or greater,
wherein the light absorbing layer has an asymmetric structure comprising two or more points with different thicknesses,
wherein the light absorbing layer comprises one or more regions in which an upper surface is an inclined surface, wherein the inclined surface is inclined at an angle of greater than 0 degrees and less than or equal to 90 degrees,
wherein the light absorbing layer comprises one or more regions having a thickness different from a thickness in any one region having the inclined surface to achieve a target color difference of the decoration element, and
wherein a difference in thickness of the light absorbing layer ranges from 2 nm to 200 nm.

2. The decoration element of claim 1, wherein the surface resistance of the light absorbing layer is 1 giga-ohm/square or greater.

3. The decoration element of claim 1, wherein the light absorbing layer is a single layer or a multilayer comprising one or more materials selected from: indium (In), tin (Sn), silicon (Si), copper (Cu), germanium (Ge), aluminum (Al), nickel (Ni), vanadium (V), tungsten (W), tantalum (Ta), molybdenum (Mo), neodymium (Nd), titanium (Ti), iron (Fe), chromium (Cr), cobalt (Co), gold (Au), silver (Ag), and oxides, nitrides or oxynitrides thereof.

4. The decoration element of claim 1, wherein the light absorbing layer comprises one or more materials selected from: copper oxides, copper nitrides, copper oxynitrides, aluminum oxides, aluminum nitrides, aluminum oxynitrides and molybdenum titanium oxynitrides.

5. The decoration element of claim 1, wherein the light reflective layer has a surface resistance of 20 ohm/square or greater.

6. The decoration element of claim 1, wherein the surface resistance of the light reflective layer is 1 giga-ohm/square or greater.

7. The decoration element of claim 1, wherein the light reflective layer is a single layer or a multilayer comprising one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof, and one, two or more types of materials among carbon and carbon composites.

8. The decoration element of claim 1, which has a surface resistance of 20 ohm/square or greater.

9. The decoration element of claim 1, which has a surface resistance of 1 giga-ohm/square or greater.

10. The decoration element of claim 1, further comprising a color film provided:
on the light absorbing layer, such that the light absorbing layer is between the color film and the light reflective layer; or
between the light reflective layer and the light absorbing layer; or
on the light reflective layer, such that the light reflective layer is between the color film and the light absorbing layer.

11. The decoration element of claim 10, further comprising a substrate provided:
on the light absorbing layer, such that the light absorbing layer is between the color film and the light reflective layer; or
on the light reflective layer, such that the light reflective layer is between the color film and the light absorbing layer.

12. The decoration element of claim 1, wherein the light absorbing layer has dichroism of ΔE*ab>1.

13. The decoration element of claim 1, wherein an upper surface of the light absorbing layer comprises:
a pattern having cone-shaped, protrusions or grooves, wherein, optionally, an upper surface of the cone-shaped protrusions or grooves is cut, or
a pattern having a protrusion in which the highest point has a line shape or a groove in which the lowest point has a line shape.

14. The decoration element of claim 13, wherein, in the pattern having cone-shaped protrusions or grooves, two or less protrusions or grooves have a same shape when an upper surface of the cone-shape protrusions or grooves are observed while rotating the cone-shaped pattern 360 degrees around the vertex of the cone-shaped protrusions.

15. The decoration element of claim 13, wherein the pattern having a protrusion in which the highest point has a line shape or a groove in which the lowest point has a line shape, has only one shape when an upper surface of the pattern is observed while rotating the pattern 360 degrees around a center of gravity of the upper surface.

16. The decoration element of claim 1, wherein the light absorbing layer has a refractive index of 0 to 8 and an extinction coefficient of greater than 0 and less than or equal to 4 at 400 nm.

17. The decoration element of claim 1, which is a deco film or a case of a mobile device.

* * * * *